United States Patent [19]
McLellan

[11] Patent Number: 5,130,783
[45] Date of Patent: Jul. 14, 1992

[54] FLEXIBLE FILM SEMICONDUCTOR PACKAGE

[75] Inventor: Neil R. McLellan, Garland, Tex.

[73] Assignee: Texas Instruments Incorporated, Dallas, Tex.

[21] Appl. No.: 664,170

[22] Filed: Mar. 4, 1991

[51] Int. Cl.$^5$ .................. H01L 23/30; H01L 23/04; H01L 23/08
[52] U.S. Cl. .......................................... 357/74; 357/72
[58] Field of Search ................ 357/80, 72, 70, 74

[56] References Cited
U.S. PATENT DOCUMENTS

| | | | |
|---|---|---|---|
| 4,710,798 | 12/1987 | Marcantonio | 357/72 |
| 4,870,476 | 9/1989 | Solstad | 357/70 |
| 5,019,673 | 5/1991 | Juskey et al. | 357/72 |

*Primary Examiner*—Rolf Hille
*Assistant Examiner*—S. V. Clark
*Attorney, Agent, or Firm*—B. Peter Barndt; Richard L. Donaldson; William E. Hiller

[57] ABSTRACT

A thin film package is formed using a lost cost TAB interconnection on a semiconductor device and sandwiching the device between thin films of plastic to form a sealed, thin, light weight package for the semiconductor device.

13 Claims, 2 Drawing Sheets

FLEXIBLE FILM SEMICONDUCTOR PACKAGE

FIELD OF THE INVENTION

This invention relates to semiconductor devices, and more particularly to a package using a thin flexible film for the packaging material.

BACKGROUND OF THE INVENTION

The demand for ever higher circuit board density has resulted in small size semiconductors devices having a low profile. Board space considerations have traditionally been viewed from a two dimensional perspective, and the motivation for thin packaging has been a secondary issue. However, with the electronics industry looking at thin packaging to address density issues associated with products like memory cards, smart cards, emulator cards, package thickness is a critical factor.

Prior art packages include conventional packaging such as National Semiconductor's TapePak TM, Tape Automated Bonding (TAB), Dual In-line Pin (DIP) packages, and Small Outline Packages (SOPs). TAB packaging uses a liquid plastic to encapsulate the semiconductor chip. Conventional prior art packages use wire bonds to connect the chip to a leadframe. Tape-Pak TM has connections along four sides of the package.

SUMMARY OF THE INVENTION

The invention is a semiconductor package in which a semiconductor device is sandwiched between two thin layers of a plastic film. The film hermetically seals the device from the environment, gives mechanical strength to the device, provides a low profile and is low a weight device. The package is low cost when compared with standard packaging techniques.

The semiconductor device may be a semiconductor die or integrated circuit having "bump" contacts in either a "chip-up" or "chip-down" configuration. Offset leads may be use in conjunction with a support ring to minimize stress on the bumplead interface.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
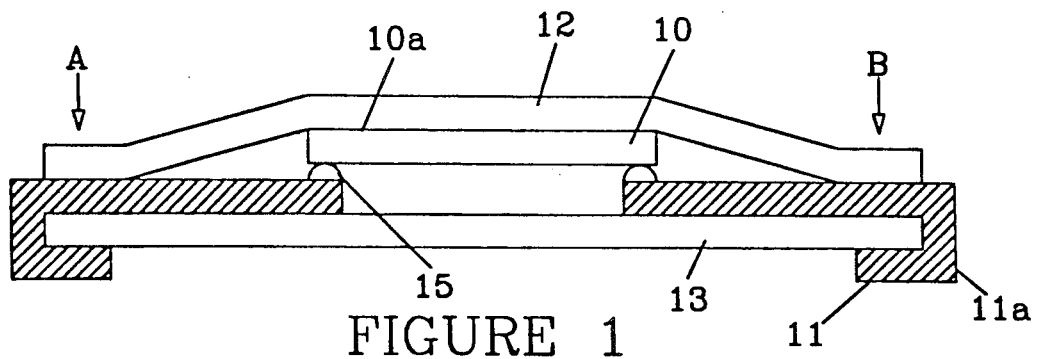
FIG. 1 is a side view, in section, of a package of the present invention.

FIG. 1 illustrates a thin film package semiconductor device. The semiconductor die 10 has a plurality of bump contacts 15 thereon. Attached to each bump contact is a lead 11. The backside 10a of the semiconductor die is covered with a thin film of material which may be, for example, Ryton, a trademarked thin film flexible material manufacture by Phillips 66. This film may be obtained in sheets of 0.005" thickness. The generic material is Polyphenylene Sulfide Resin. The under side of the semiconductor die and the leads 11 are also covered by the plastic film. An ultrasonic bond is made between the film and leads in the regions indicated by arrows A and B. Leads may optionally be folded around the bottom film as illustrated in FIG. 1. The leads, in one embodiment, were made from a palladium plated leadframe.

Figure 2:
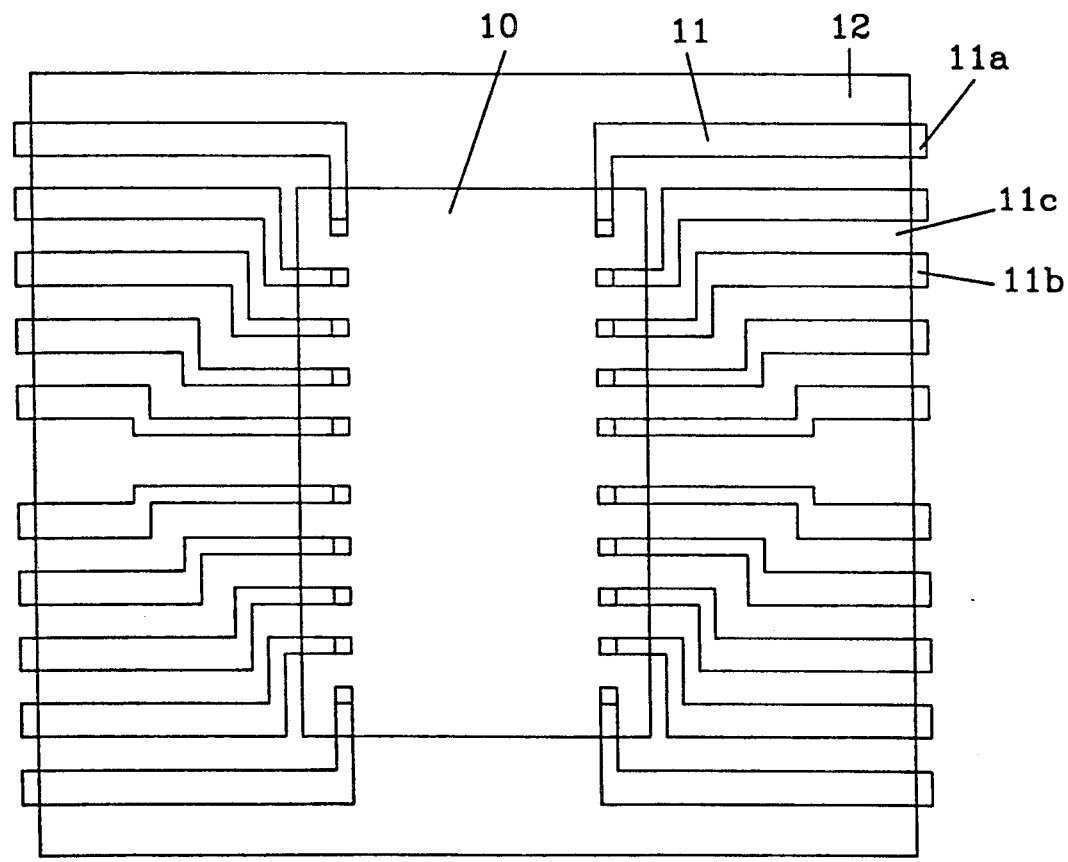
FIG. 2 is a top view of the package of FIG. 1.

FIG. 2 is a top view of the device of FIG. 1 illustrating the typical layout of leads on an integrated circuit device. Leads 11 are arrayed around the device 10 and extend out the sides of the device. The plastic film covers the device and leads, except for the ends of the leads 11a which provide external electrical contact to the integrated circuit. The number of leads and arrangement of the leads is not a critical factor, but may be arrayed around the semiconductor device depending upon the device configuration.

The package is light weight, and, in one embodiment, is about 0.03" thick. This thin film package device is functional mechanically as well as electrically, and in most instances provide a cleaner and better sealed device than the standard epoxy molded device. No mechanical degradation has been observed during storage or solder dunk at 250° C. during lead solder coating.

The process flow for the package includes the steps of tab bonding the wafer to a lead frame or leads, placing the device and leads between two sheets of film and ultrasonically sealing the film around the leads. The film seals to itself between the leads 11c and to the leads 11b to form a hermetic seal. Sealing of the film may be done prior to separating a plurality of devices on a continuous strip of lead frame. After sealing, the device may be symbolized and then separated into individual devices prior to testing.

Figure 3:
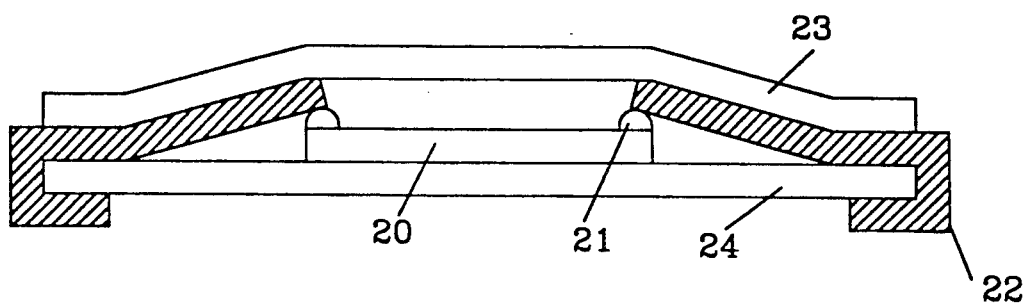
FIG. 3 is a side view of a package with the semiconductor die contact side up.

FIG. 3 illustrates an second embodiment of the thin film package. The semiconductor device or integrated circuit 20 has a plurality of contacts 21 thereon. The leads 22 are bonded to the contacts and then angled downward to the plane of the semiconductor device. Thereafter, the top film 23 and bottom film 24 is sealed around the device, and to the leads 22.

Figure 4:
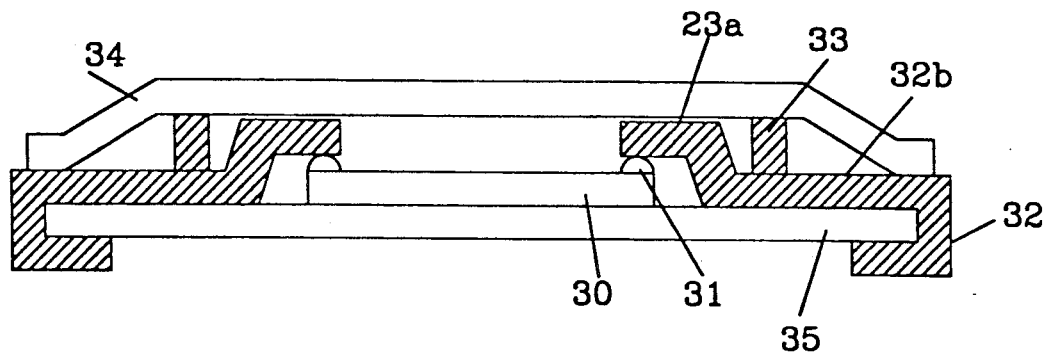
FIG. 4 is a side view of a package with an offset lead and support ring.

FIG. 4 is another embodiment of the thin film package. The semiconductor device 30 is mounted with the contact side up. Leads are connected to the contacts and then bent downwardly to lie in the plane of the semiconductor device. A support ring 33 of an insulating material is mounted on the part of the lead 32b that is in the plane of the semiconductor device, and extends above the part of the lead 32a bonded to contact 31. Plastic film 34 is applied over the contacts 32 and support ring 33, and a second sheet of film 35 is placed under the semiconductor device 30. Support ring 33 relieves and minimizes stress or pressure on the junction of contact 31 and lead end 32a. The use of the support ring can also be used on devices which are wire bonded. The ring may extend completely around the device or be located just in the area of the leads/contacts.

What is claimed:

1. A thin film semiconductor device package, comprising:

a semiconductor device;

a plurality of leads having one end attached to the semiconductor device and a second end extending away from the semiconductor device;

a first thin film on one side of the semiconductor die and leads; and a second thin film on the side of the semiconductor die and leads opposite said first thin film;

wherein said first and second thin films are bonded to each other between said leads, and bonded to said leads to form a sealed thin film package for said semiconductor device, with said second ends extending from said thin film package.

2. The thin film package according to claim 1, wherein said first and second thin films have an ultrasonic bond therebetween.

3. The thin film package according to claim 1, wherein said second lead ends extend out from where said first and second thin films are bonded to each other between said leads, and where said thin films are bonded to said leads.

4. The thin film package according to claim 1, including a metal ring within the thin film package supporting the thin film in the region where the lead ends are attached to the semiconductor device.

5. The thin film package according to claim 1, wherein the thin film is a polyphenylene sulfide resin.

6. The thin film package according to claim 1, wherein the leads are connected to the semiconductor device with a TAB bond.

7. The thin film package according to claim 1, wherein the thin film a plurality of semiconductor devices on a continuous leadframe strip.

8. A thin film semiconductor device package, comprising:

a semiconductor device;

a plurality of leads having one end attached to the semiconductor device and a second end extend away from the semiconductor device;

a first thin film on one side of the semiconductor die and leads;

a second thin film on the side of the semiconductor die and leads opposite said first thin film; and a metal ring within the thin film package supporting the thin film in the region where the lead ends are attached to the semiconductor device.

wherein said first and second thin films are bonded to each other between said leads and bonded to said leads to form a sealed thin film package for said semiconductor device with said second ends extending from said thin film package.

9. The thin film package according to claim 8, wherein said first and second thin films have an ultrasonic bond therebetween.

10. The thin film package according to claim 8, wherein said second lead ends extend out from where said first and second thin films are bonded to each other between said leads, and where the thin films are bonded to said leads.

11. The thin film package according to claim 8, wherein the thin film is a polyphenylene sulfide resin.

12. The thin film package according to claim 8, wherein the leads are connected to the semiconductor device with a TAB bond.

13. The thin film package according to claim 8, wherein the thin film seals a plurality of semiconductor devices on a continuous leadframe strip.

* * * * *